United States Patent
Hong et al.

(10) Patent No.: US 9,754,826 B2
(45) Date of Patent: Sep. 5, 2017

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Jong-Won Hong, Hwaseong-si (KR); Hei-Seung Kim, Suwon-si (KR); Kyoung-Hee Nam, Seoul (KR); In-Sun Park, Seoul (KR); Jong-Myeong Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/155,478

(22) Filed: May 16, 2016

(65) Prior Publication Data

US 2016/0260635 A1      Sep. 8, 2016

Related U.S. Application Data

(62) Division of application No. 13/588,393, filed on Aug. 17, 2012, now Pat. No. 9,355,851.

(30) Foreign Application Priority Data

Nov. 30, 2011   (KR) .......................... 10-2011-0126479

(51) Int. Cl.
| | | |
|---|---|---|
| H01L 21/763 | (2006.01) | |
| H01L 21/768 | (2006.01) | |
| H01L 23/532 | (2006.01) | |
| H01L 27/11529 | (2017.01) | |
| H01L 21/288 | (2006.01) | |
| H01L 27/108 | (2006.01) | |

(52) U.S. Cl.
CPC .... *H01L 21/76879* (2013.01); *H01L 21/2885* (2013.01); *H01L 21/76846* (2013.01); *H01L 21/76847* (2013.01); *H01L 21/76861* (2013.01); *H01L 21/76864* (2013.01); *H01L 21/76873* (2013.01); *H01L 21/76877* (2013.01); *H01L 21/76882* (2013.01); *H01L 23/53238* (2013.01); *H01L 27/10897* (2013.01); *H01L 27/11529* (2013.01); *H01L 27/10894* (2013.01); *H01L 2221/1089* (2013.01); *H01L 2924/0002* (2013.01)

(58) Field of Classification Search
CPC ............. H01L 21/762; H01L 21/76224; H01L 21/763
See application file for complete search history.

(56) References Cited

U.S. PATENT DOCUMENTS

| | | | |
|---|---|---|---|
| 5,939,788 | A | 8/1999 | McTeer |
| 2004/0063276 | A1 | 4/2004 | Yamamoto et al. |

FOREIGN PATENT DOCUMENTS

| | | |
|---|---|---|
| JP | 2010-080525 A | 4/2010 |
| KR | 10-0904613 B1 | 6/2009 |

*Primary Examiner* — Mohammad Choudhry
(74) *Attorney, Agent, or Firm* — Harness, Dickey & Pierce, P.L.C.

(57) ABSTRACT

A semiconductor device includes a metal pattern filling a trench formed through at least a portion of an insulating interlayer on a substrate and including copper, and a wetting improvement layer pattern in the metal pattern including at least one of tantalum, tantalum nitride, titanium, titanium nitride, ruthenium, cobalt and manganese.

8 Claims, 12 Drawing Sheets

SEMICONDUCTOR DEVICES AND METHODS OF MANUFACTURING THE SAME

CROSS-REFERENCE TO RELATED APPLICATION

This application is a divisional application of U.S. application Ser. No. 13/588,393, filed on Aug. 17, 2012, which claims priority under 35 USC §119 to Korean Patent Application No. 10-2011-0126479 filed on Nov. 30, 2011 in the Korean Intellectual Property Office (KIPO), the entire contents of each of which are incorporated herein by reference.

BACKGROUND

1. Field

Some example embodiments relate to semiconductor devices and/or methods of manufacturing the same. For example, some example embodiments relate to wiring structures including copper and/or methods of manufacturing the same.

2. Description of the Related Art

When a copper wiring is formed, after forming a trench on an insulating interlayer and forming a seed layer on an inner wall of the trench, a remaining portion of the trench may be filled by an electrolytic plating process. According to the higher integration degree of semiconductor devices, the trench may have a decreased width, and an upper portion of the trench may be filled first during the electrolytic plating process so that the trench may not be completely filled and a void may be generated therein. In order to solve the problem, an additive including a suppressor, an accelerator and a leveler may be used. However, the void still may not be sufficiently removed.

SUMMARY

Some example embodiments provide a semiconductor device including a copper wiring structure, and/or a method of manufacturing a semiconductor device including a copper wiring structure with no void therein.

According to an example embodiment, a semiconductor device includes a metal pattern filling a trench through at least a portion of an insulating interlayer on a substrate, the metal pattern including copper, and a wetting improvement layer pattern in the metal pattern, the wetting improvement layer pattern including at least one of tantalum, tantalum nitride, titanium, titanium nitride, ruthenium, cobalt and manganese.

In an example embodiment, the wetting improvement layer pattern may have a width equal to or less than about ½ of a width of the trench and is formed at a central portion of the trench. In an example embodiment, a barrier layer pattern may be between the metal pattern and the insulating interlayer, and the barrier layer pattern may include at least one of tantalum, tantalum nitride, titanium, titanium nitride, ruthenium, cobalt and manganese. In an example embodiment, a contact plug may be electrically connected to the metal pattern and the substrate.

In an example embodiment, the substrate may include a cell region and a peripheral circuit region, a first gate structure may be on the cell region, a second gate structure may be on the peripheral circuit region, and the contact plug may be electrically connected to a portion of the substrate adjacent to the second gate structure. In an example embodiment, the first gate structure may include a tunnel insulation layer pattern, a floating gate, a dielectric layer pattern and a control gate sequentially stacked on the substrate. In an example embodiment, the first gate structure may include a gate insulation layer pattern, a gate electrode and a gate mask sequentially stacked on the substrate.

According to another example embodiment, a method of manufacturing a semiconductor device includes forming a trench on an insulating interlayer on a substrate, forming a first seed layer on an inner wall of the trench and on the insulating interlayer, the first seed layer having a first thickness on an upper portion of the trench greater than a second thickness on a lower portion of the trench, forming a preliminary metal layer filling the lower portion of the trench by performing a reflow process on the first seed layer, forming a wetting improvement layer on a portion of the preliminary metal layer on the upper portion of the trench, and forming a metal layer filling the trench by a electrolytic plating process.

In another example embodiment, the forming a metal layer may include performing the electrolytic plating process using an additive and an electrolyte, the additive having a suppressor, an accelerator and a leveler, and the electrolyte including a copper ion. In another example embodiment, the forming a wetting improvement layer may include forming at least one of tantalum, tantalum nitride, titanium, titanium nitride, ruthenium, cobalt and manganese. In another example embodiment, a barrier layer may be formed on the inner wall of the trench and on the insulating interlayer prior to the forming a first seed layer.

In another example embodiment, the forming a first seed layer may include performing a sputtering process using copper as a target when a bias power is applied to the substrate. In another example embodiment, the forming a preliminary metal layer may expose a portion of the inner wall of the trench, and a second seed layer may be formed on the exposed portion of the inner wall of the trench. In another example embodiment, the wetting improvement layer may be formed on the preliminary metal layer in the trench.

In another example embodiment, oxidized portions of the preliminary metal layer and the wetting improvement layer may be reduced prior to the forming a metal layer. In another example embodiment, the metal layer may be planarized until the insulating interlayer is exposed after the forming a metal layer, and the wetting improvement layer on the upper portion of the trench may be removed by the planarization of the metal layer.

According to another example embodiment, a semiconductor device includes an insulating interlayer on a substrate, and a wiring structure filling an entire space within a trench in the insulating interlayer such that no voids are formed therein, the wiring structure including a barrier layer pattern on sidewalls of the trench, a metal pattern on the barrier layer pattern, and a wetting improvement layer pattern in the metal pattern, the wetting pattern configured to serve as an impurity so that electro-migration (EM) among metal crystals in the metal pattern decreases.

In another example embodiment, the metal pattern may include copper. In another example embodiment, the barrier layer pattern and the wetting improvement layer pattern may include a same metal, and the same metal may be at least one of tantalum, tantalum nitride, titanium, titanium nitride, ruthenium, cobalt and manganese. The wetting improvement layer pattern may have a width equal to or less than about ½ of a width of the trench and may be formed at a central portion of the trench.

According to some example embodiments, when forming a copper wiring, a seed layer may be formed on an inner wall of a trench at an upper portion of an insulating interlayer, and a reflow process may be performed to form an overhang-shaped preliminary metal layer. A wetting improvement layer may be formed on a portion of the preliminary metal layer at an upper portion of the trench. When an electrolytic plating process is performed using an electrolyte and additive including a suppressor, the suppressor may be well wetted on the wetting improvement layer and may not depart therefrom, and thus the speed of copper plating at the upper portion of the trench may be effectively reduced. Thus, the upper portion of the trench may not be filled first, and void may not be generated in the trench. Accordingly, a copper wiring having desirable electrical characteristics may be formed.

BRIEF DESCRIPTION OF THE DRAWINGS

Example embodiments will be more clearly understood from the following detailed description taken in conjunction with the accompanying drawings. FIGS. 1 to 21 represent non-limiting, example embodiments as described herein.

FIG. 1 is a cross-sectional view illustrating a semiconductor device in accordance with an example embodiment;

FIGS. 2 to 8 are cross-sectional views illustrating a method of manufacturing a semiconductor device in accordance with an example embodiment;

FIG. 9 is a cross-sectional view illustrating a semiconductor device in accordance with another example embodiment;

FIGS. 10 to 13 are cross-sectional views illustrating a method of manufacturing a semiconductor device in accordance with another example embodiment;

FIG. 14 is a cross-sectional view illustrating a semiconductor device in accordance with another example embodiment; and FIGS. 15 to 17 are cross-sectional views illustrating a method of manufacturing a semiconductor device in accordance with another example embodiment.

DETAILED DESCRIPTION OF EXAMPLE EMBODIMENTS

Figure 1:
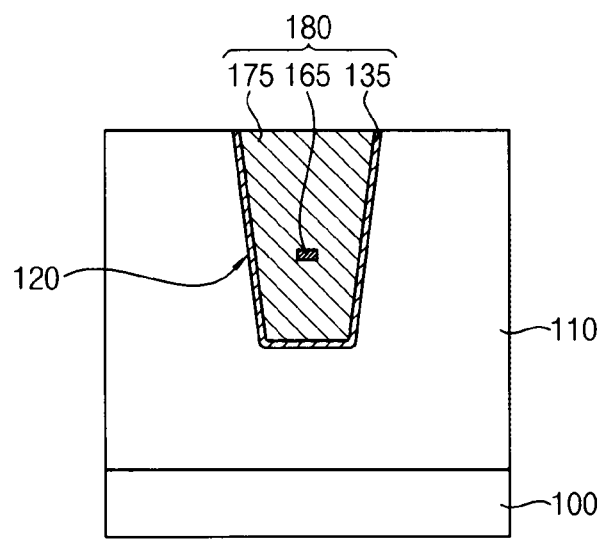

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

FIG. 1 is a cross-sectional view illustrating a semiconductor device in accordance with an example embodiment. Referring to FIG. 1, the semiconductor device may include a wiring structure 180 filling a trench 120 through at least a portion of an insulating interlayer 110 on a substrate 100.

The substrate 100 may be a silicon substrate, a germanium substrate, a silicon-germanium substrate, a silicon-on-insulator (SOI) substrate, a germanium-on-insulator (GOI) substrate, etc. The insulating interlayer 110 may include an oxide, e.g., silicon or a nitride, e.g., silicon nitride.

In an example embodiment, the trench 120 may be formed at an upper portion of the insulating interlayer 110. Alternatively, the trench 120 may be formed through the insulating interlayer 110 to expose a top surface of the substrate 100. In an example embodiment, the trench 120 may have a width equal to or less than about 20 nm. The wiring structure 180 may have a barrier layer pattern 135, a metal pattern 175 and a wetting improvement layer pattern 165.

The barrier layer pattern 135 may be formed on an inner wall of the trench 120. For example, the barrier layer pattern 135 may include a metal and/or a metal nitride such as tantalum, tantalum nitride, titanium, titanium nitride, ruthenium, cobalt, manganese, etc.

The metal pattern 175 may be formed on the barrier layer pattern 135 and fill a remaining portion of the trench 120. The metal pattern 175 may have no void therein. In an example embodiment, the metal pattern 175 may include copper.

The wetting improvement layer pattern 165 may be formed in the trench, e.g., in the metal layer pattern 175. In an example embodiment, the wetting improvement layer pattern 165 may be placed at a central portion of the trench 120. For example, the wetting improvement layer pattern 165 may include a metal and/or a metal nitride such as tantalum, tantalum nitride, titanium, titanium nitride, ruthenium, cobalt, manganese, etc.

In an example embodiment, the wetting improvement layer pattern 165 may have a width equal to or less than about 10 nm, e.g., equal to or less than about ½ of the width of the trench 120.

The wiring structure 180 may include the metal pattern 175 having copper of relatively low resistance and no void therein, thereby having desirable electrical characteristics. The metal pattern 175 may have the wetting improvement layer pattern 165 including a metal, e.g., tantalum, titanium, etc., which may serve as an impurity so that the electromigration (EM) among metal crystals in the metal pattern 175 may be decreased. Accordingly, the wiring structure 180 may have an enhanced reliability.

Figure 2:
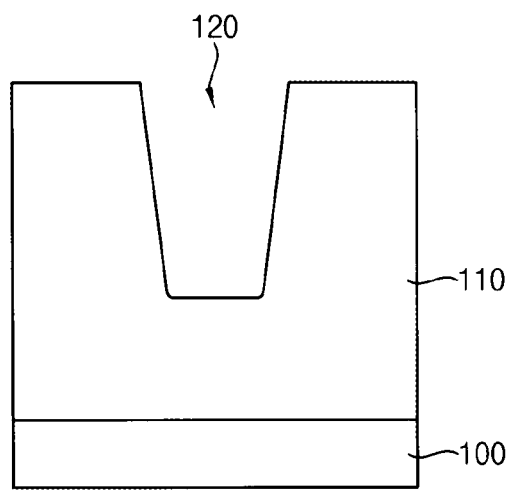

FIGS. 2 to 8 are cross-sectional views illustrating a method of manufacturing a semiconductor device in accordance with an example embodiment. Referring to FIG. 2, an insulating interlayer 110 may be formed on a substrate 100, and a trench 120 may be formed at a portion of the insulating interlayer 110.

The substrate 100 may be a silicon substrate, a germanium substrate, a silicon-germanium substrate, an SOI substrate, a GOI substrate, etc. The insulating interlayer 110 may include an oxide, e.g., silicon oxide or a nitride, e.g., silicon nitride.

The trench 120 may be formed by removing a portion of the insulating interlayer 110, and thus penetrate at least a portion of the insulating interlayer 110. In an example embodiment, the trench 120 may be formed at an upper portion of the insulating interlayer 110. Alternatively, the trench 120 may be formed through the insulating interlayer 110. In an example embodiment, the trench 120 may be formed to a width equal to or less than about 20 nm.

Figure 3:
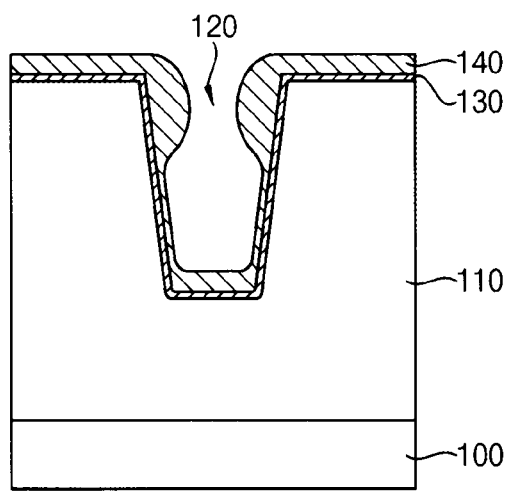

Referring to FIG. 3, a barrier layer 130 and a first seed layer 140 may be sequentially formed on an inner wall of the trench 120 and on the insulating interlayer 110. The barrier layer 130 may be formed by a chemical vapor deposition (CVD) process, an atomic layer deposition (ALD) process or a physical vapor deposition (PVD) process. For example, the barrier layer 130 may be formed to include a metal and/or a metal nitride such as tantalum, tantalum nitride, titanium, titanium nitride, ruthenium, cobalt, manganese, etc.

The first seed layer 140 may be formed by a PVD process such as a sputtering process. For example, the first seed layer 140 may be formed by a sputtering process using copper as a target.

The first seed layer 140 may be formed by a PVD process having undesirable step coverage, and thus, the first seed layer 140 may have a relatively thick thickness at an upper portion of the trench 120. That is, the first seed layer 140 may be formed to have an overhang shape around the trench 120. However, the first seed layer 140 may not completely fill the upper portion, e.g., the entrance of the trench 120. In an example embodiment, the upper portion of the trench 120 may have a width equal to or less than about 10 nm after the formation of the first seed layer 140.

In an example embodiment, the first seed layer 140 may be formed to have a thicker thickness by a sputtering process in which a bias power may be applied to the substrate 100.

In an example embodiment, during the biased sputtering process, a silicon oxide component of the insulating interlayer 110 and a metal component of the barrier layer 130 or the first seed layer 140 may be reacted to form a metal oxide, and thus a portion of the first seed layer 140 at the upper portion of the trench 120 may not move to a lower portion of the trench 120, so that the overhang shape of the first seed layer 130 may be maintained.

Figure 4:
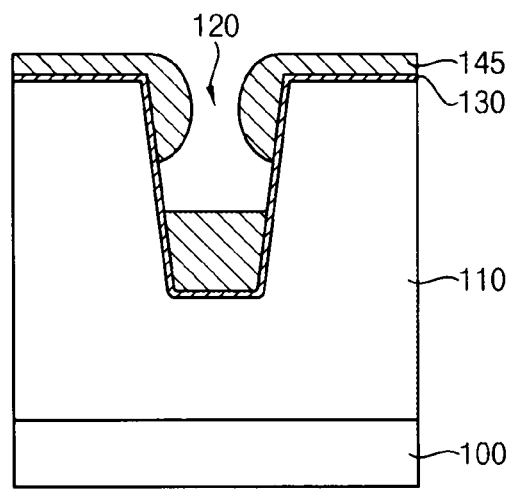

Referring to FIG. 4, a reflow process may be performed on the first seed layer 140 to form a first preliminary metal layer 145 filling a lower portion of the trench 120. A portion of the first seed layer 140 near a sidewall of the trench 120 may move down to fill a lower portion of the trench 120 and a portion of the barrier layer 130 on the sidewall of the trench 120 may be exposed. However, the portion of the first seed layer 140 at the upper portion of the trench 120 may maintain the relatively thick thickness, and thus, the first preliminary metal layer 145 may also have an overhang shape around the trench 120. The first preliminary metal layer 145 may not completely fill the upper portion of the trench 120. In an example embodiment, the reflow process may be performed by a heat treatment or a plasma treatment. The heat treatment may be performed at a temperature equal to or less than about 400° C. for about several seconds to about several tens seconds. In an example embodiment, the reflow process may be performed using hydrogen, argon, nitrogen, etc.

Figure 5:
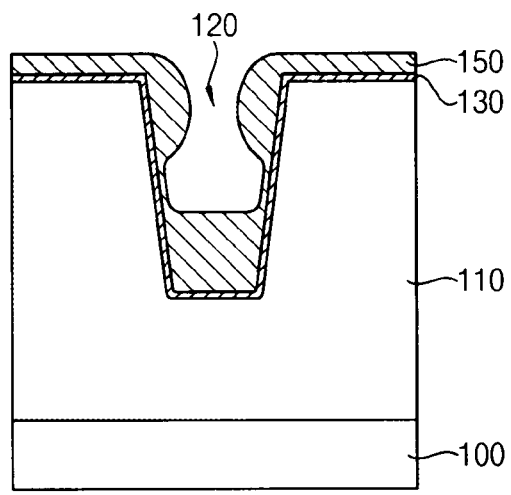

Referring to FIG. 5, a second seed layer (not shown) may be formed to cover the portion of the barrier layer 130 that has been exposed during the reflow process. In an example embodiment, the second seed layer may be formed to include a material substantially the same as that of the first seed layer 140 or the first preliminary metal layer 145, e.g., copper, and thus the second seed layer may be merged into the first preliminary metal layer 145. Hereinafter, the merged layer may be referred to as a second preliminary metal layer 150.

In an example embodiment, the second preliminary metal layer 150 may be formed by a CVD process, an ALD process or a PVD process. The second preliminary metal layer 150 may not completely fill an upper portion of the trench 120 and have an overhang shape at the upper portion of the trench 120. In an example embodiment, the upper portion of the trench 120 may have a width equal to or less than about 10 nm, and may have a width equal to or less than about ½ of a width of an upper portion of the trench 120 before forming the barrier layer 130 and the second preliminary metal layer 150. If no portion of the barrier layer 130 is exposed during the reflow process, the second seed layer may not be formed.

Figure 6:
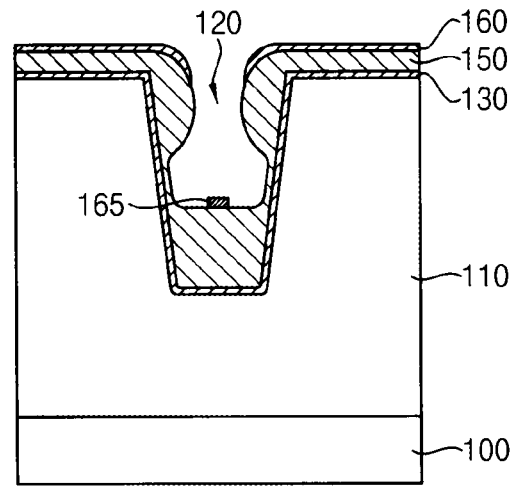

Referring to FIG. 6, a wetting improvement layer 160 may be formed on a portion of the second preliminary metal layer 150 at an upper portion of the trench 120.

In an example embodiment, the wetting improvement layer 160 may be formed by a PVD process, e.g., a sputtering process. For example, the wetting improvement layer 160 may be formed to include a metal and/or a metal nitride such as tantalum, tantalum nitride, titanium, titanium nitride, ruthenium, cobalt, manganese, etc. The wetting improvement layer 160 may be formed to have a single-layered structure or a multi-layered structure.

The second preliminary metal layer 150 may have an overhang shape at an upper portion of the trench 120, e.g., have a relatively thick thickness at the upper portion of the trench 120, and a PVD process may have undesirable step coverage, so that the wetting improvement layer 160 may be mainly formed at the upper portion of the trench 120 or on a portion of the second preliminary metal layer 150 on a top surface of the insulating interlayer 110. However, the upper portion of the trench 120 may not be completely filled, and thus, the wetting improvement layer 160 may be also formed on a portion of the second preliminary metal layer 150 in the trench 120. The second preliminary metal layer 150 may fill the lower portion of the trench 120 so that the wetting improvement layer 160 may be formed at a central portion of the trench 120. In an example embodiment, the upper portion of the trench 120 may have a width equal to or less than about 10 nm, and thus the portion of the wetting improvement layer 160 at the central portion of the trench 120 may have a width equal to or less than about 10 nm.

Figure 7:
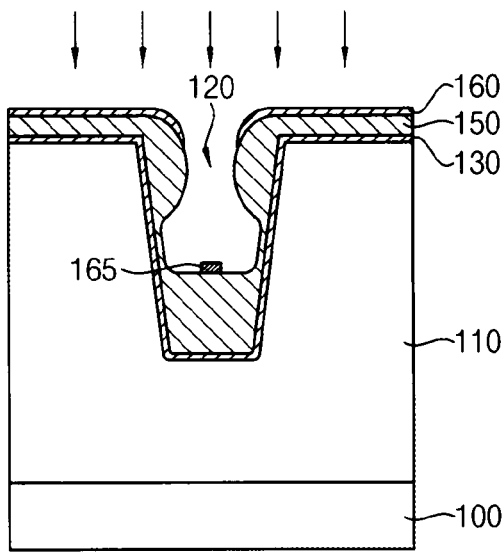

Referring to FIG. 7, a reduction process may be performed so that portions of the second preliminary metal layer 150 and the wetting improvement layer 160 that have been oxidized may be reduced, thereby forming a wetting improvement layer pattern 165.

That is, when metal components of the second preliminary metal layer 150 and the wetting improvement layer 160 exposed to air may be oxidized before a subsequent electrolytic plating process, a heat treatment may be performed under a hydrogen atmosphere to remove a metal oxide. In an example embodiment, the reduction process may be performed at a temperature equal to or less than about 400° C. The reduction process may be omitted.

Figure 8:
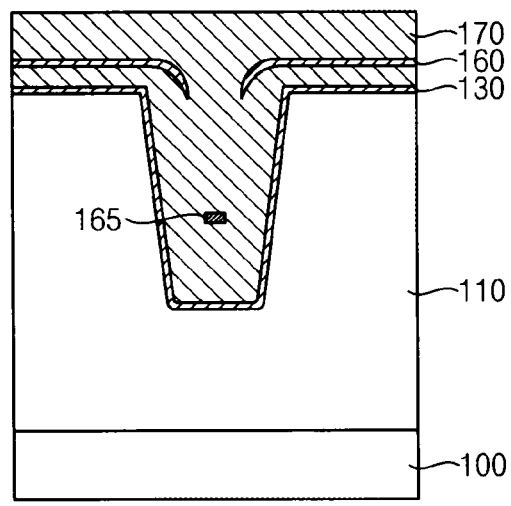

Referring to FIG. 8, an electrolytic plating process may be performed to form a metal layer 170 sufficiently filling a remaining portion of the trench 120.

In an example embodiment, the electrolytic plating process may be performed using electrolyte including copper ion and an additive. In an example embodiment, the electrolyte may include $CuSO_4$, $5H_2O$, $H_2SO_4$, HCl, etc. In an example embodiment, the additive may include a suppressor (not shown), an accelerator (not shown) and a leveler (not shown). The suppressor may include a polymer, e.g., polyethylene glycol (PEG), the leveler may include a polymer, e.g., polyimine, polyamide, etc., and the accelerator may include an organic sulfur compound.

The accelerator may have a relatively small molecular size, thereby permeating into the inside of the trench 120. However, the suppressor may have a relatively large molecular size so that the suppressor may not permeate into the inside of the trench 120 but be placed at an upper portion of the trench 120 or on a portion of the second preliminary metal layer 150 on a top surface of the insulating interlayer 110. The wetting improvement layer 160 may be mainly formed at the upper portion of the trench 120 or on the portion of the second preliminary metal layer 150 on the top surface of the insulating interlayer 110, and the suppressor may have an increased wetting with respect to the wetting improvement layer 160 rather than the second preliminary metal layer 150. When the wetting improvement layer 160 includes tantalum, the suppressor may have a contact angle smaller with respect to a surface of a tantalum layer than with respect to a surface of the second preliminary metal layer 150 including copper by about 5 to about 10%. Thus, the suppressor may not depart from the wetting improvement layer 160 but be wetted therewith.

As a result, while a copper plating is accelerated by the accelerator in the trench 120, the copper plating may be suppressed by the suppressor at the upper portion of the trench 120, and thus the upper portion of the trench 120 may not be filled before the trench 120 may be sufficiently filled. Accordingly, voids may be inhibited (or, alternatively prevented) from being generated in the trench 120.

In an example embodiment, after sufficiently filling the trench 120, an applied current during the electrolytic plating process may be increased, thereby increasing the speed of the electrolytic plating.

Referring to FIG. 1 again, an upper portion of the metal layer 170 may be planarized so that a metal pattern 175 and a barrier layer pattern 135 may be formed in the trench 120.

In an example embodiment, the planarization process may be performed by a chemical mechanical polishing (CMP) process. In an example embodiment, the planarization process may be performed until a top surface of the insulating interlayer 110 is exposed, and thus portions of the wetting improvement layer 160 at the upper portion of the trench 120 and on the top surface of the insulating interlayer 110 may be removed. When the portion of the wetting improvement layer 160 at the upper portion of the trench 120 is not sufficiently removed, the planarization process may be performed until an upper portion of the insulating interlayer 110 is removed, so that the portion of the wetting improvement layer 160 may be sufficiently removed.

A portion of the wetting improvement layer 160 in the trench 120, e.g., in the metal pattern 175, may remain, and may be referred to as a wetting improvement layer pattern 165. The metal pattern 175, the barrier layer pattern 135 and the wetting improvement layer pattern 165 may form a wiring structure 180.

By the above processes, the semiconductor device including the wiring structure 180 may be manufactured. A contact plug (not shown) or another wiring (not shown) may be further formed on the wiring structure 180, and a contact plug (not shown) may be further formed between the substrate 100 and the wiring structure 180.

Figure 9:
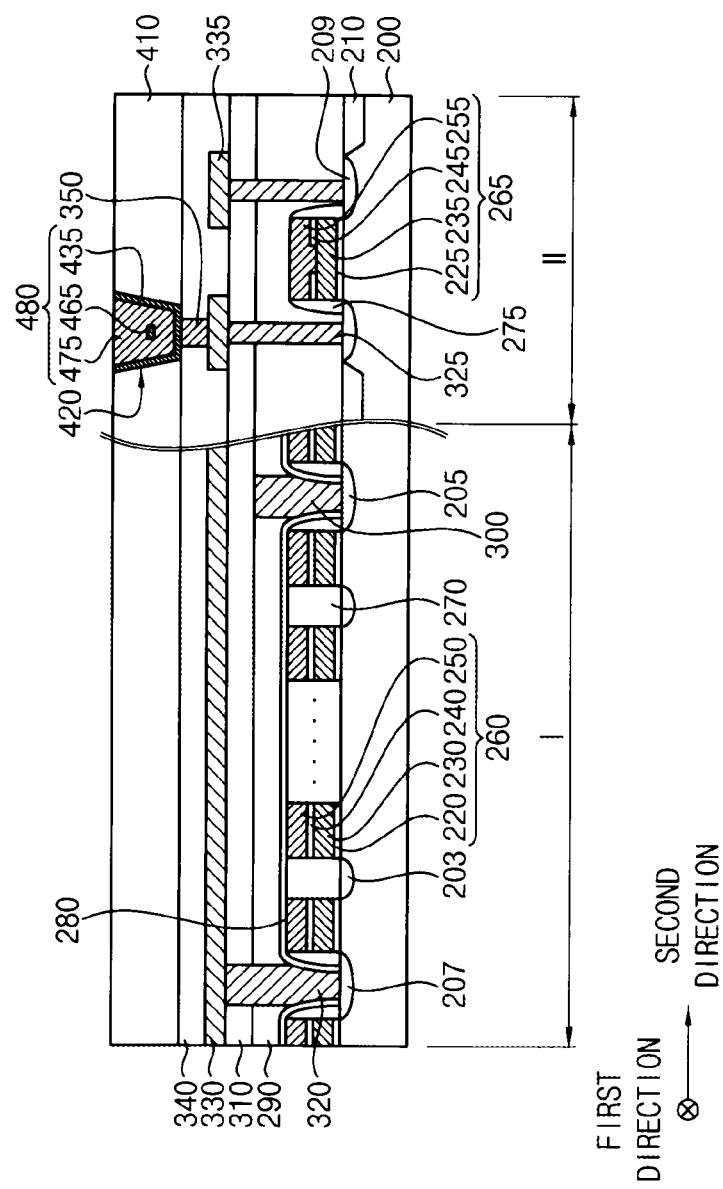

FIG. 9 is a cross-sectional view illustrating a semiconductor device in accordance with example embodiments. FIG. 9 illustrates a flash memory device, however, the present inventive concept may not be limited thereto.

Referring to FIG. 9, the semiconductor device may include first and second gate structures 260 and 265 and a wiring structure 480. The semiconductor device may further include impurity regions 203, 205, 207 and 209, a common source line (CSL) 300, a bit line 330, contact plugs 320, 325 and 350 and a pad 335.

The substrate 200 may be divided into a field region in which an isolation layer 210 is formed and an active region in which no isolation layer is formed. The substrate 200 may include a cell region I in which memory cells are formed and a peripheral circuit region II in which peripheral circuits are formed. In an example embodiment, the active region may extend in the cell region I of the substrate 100 in a second direction parallel to a top surface of the substrate 200, and a plurality of active regions may be formed in a first direction substantially perpendicular to the second direction. In FIG. 9, only the active region in the cell region I is illustrated.

The first gate structure 260 may include a first tunnel insulation layer pattern 220, a first floating gate 230, a first dielectric layer pattern 240 and a first control gate 250 sequentially stacked on the cell region I of the substrate 200. In an example embodiment, the first gate structure 260 may extend in the first direction, and a plurality of first gate structures 260 may be formed in the second direction. The second gate structure 265 may include a second tunnel insulation layer pattern 225, a second floating gate 235, a second dielectric layer pattern 245 and a second control gate 255 sequentially stacked on the peripheral circuit region II of the substrate 200. A portion of the second control gate 255 may make contact with the second floating gate 235 so that the second control gate 255 and the second floating gate 235 may be electrically connected to each other.

The first and second tunnel insulation layer patterns 220 and 225 may include an oxide, e.g., silicon oxide, an oxynitride, e.g., silicon oxynitride, silicon oxide doped with impurities, a low-k dielectric material, etc., and the first and second floating gates 230 and 235 may include doped polysilicon or a metal having a high work function, e.g., tungsten, titanium, cobalt, nickel, etc. The first and second dielectric layer patterns 240 and 245 may include an oxide and/or a nitride. The first and second dielectric layer patterns 240 and 245 may be an oxide/nitride/oxide (ONO) layer or a metal oxide layer having a high dielectric constant. For example, the high-k dielectric material may include hafnium oxide, titanium oxide, tantalum oxide, zirconium oxide, aluminum oxide, etc. The first and second control gates 250 and 255 may include doped polysilicon, a metal, a metal nitride, a metal silicide, etc.

Alternatively, the first and second gate structures 260 and 265 may include a charge trapping layer patterns (not shown), blocking layer patterns (not shown) and gate electrodes (not shown) sequentially stacked on the tunnel insulation layer patterns 220 and 225.

The charge trapping layer patterns may include a nitride, e.g., silicon nitride or an oxide, e.g., hafnium oxide. The blocking layer patterns may include silicon oxide or a metal oxide having a high dielectric constant, e.g., hafnium oxide, titanium oxide, tantalum oxide, zirconium oxide, aluminum oxide. The gate electrodes may include doped polysilicon, a metal of a relatively low resistance, e.g., aluminum, copper, etc., a metal nitride, a metal silicide, etc.

Hereinafter, only the case in which the floating gates 230 and 235, dielectric layer patterns 240 and 245 and control gates 250 and 255 are sequentially stacked on the tunnel insulation layer patterns 220 and 225 may be illustrated.

In an example embodiment, the first tunnel insulation layer patterns 220 may be islands in relation to each other on the active region of the substrate 100, and the first floating gates 230 may also be similar islands thereon. Each of the first dielectric layer patterns 240 and the first control gates 250 may extend in the first direction. The first dielectric layer patterns 240 and the first control gates 250 may be sequentially stacked on the first floating gates 230 and the isolation layer 210. Alternatively, the first tunnel insulation layer patterns 220 may not be islands in relation to each other, but extend in the second direction on the active region of the substrate.

The first to fourth impurity regions 203, 205, 207 and 209 may be formed at upper portions of the active region of the substrate 200 adjacent to the first and second gate structures 260 and 265. Particularly, the first impurity region 203 may be formed at an upper portion of the substrate 200 between the first gate structures 260 that may be spaced apart from each other at a relatively short distance in the cell region I, and the second and third impurity regions 205 and 207 may be formed at upper portions of the substrate 200 between the first gate structures 260 that may be spaced apart from each other at a relatively long distance in the cell region I. The fourth impurity region 209 may be formed at an upper portion of the substrate 200 adjacent to the second gate structure 265 in the peripheral circuit region II. In an example embodiment, a plurality of the first gate structures 260 between the second and third impurity regions 205 and 207 and the first impurity region 203 may form a string.

First and second spacers 270 and 275 may be formed at sidewalls of the first and second gate structures 260 and 265, respectively. Spaces between the first gate structures 260 spaced apart from each other at a relatively short distance in the cell region I, e.g., spaces between the first gate structures 260 in a string, may be filled by the first spacers 270. In an example embodiment, the spacers 270 and 275 may include silicon nitride or silicon oxide.

A protection layer pattern 280 may be formed on the first gate structures 260 and the first spacers 270, and a first insulating interlayer 290 covering the protection layer pattern 280, the second gate structure 265 and the second spacer 275 may be formed on the substrate 200. The protection layer pattern 280 may include, e.g., silicon nitride, and the first insulating interlayer 290 may include, e.g., silicon oxide such as BPSG, USG, SOG, etc.

The CSL 300 may be formed through the first insulating interlayer 290 to make contact with the second impurity region 205. The CSL 300 may include, e.g., doped polysilicon, a metal or a metal silicide.

A second insulating interlayer 310 may be formed on the first insulating interlayer 290 and the CSL 300. The second insulating interlayer 310 may include, e.g., silicon oxide such as BPSG, USG, SOG, etc.

The first contact plug 320 may be formed through the first and second insulating interlayers 290 and 310 to make contact with the third impurity region 207. The second contact plug 325 may be formed through the first and second insulating interlayers 290 and 310 to make contact with the fourth impurity region 209. The first and second contact plugs 320 and 325 may include, e.g., doped polysilicon, a metal or a metal silicide.

The bit line 330 and the pad 335 may be formed on the second insulating interlayer 310 to be electrically connected to the first contact plug 320 and the second contact plug 325, respectively. In an example embodiment, the bit line 330 may extend in the second direction. A wiring (not shown) having substantially the same structure as that of the wiring structure 480 may be formed instead of the pad 335.

A third insulating interlayer 340 covering the bit line 330 and the pad 335 may be formed on the second insulating interlayer 310. The third insulating interlayer 340 may include, e.g., silicon oxide such as BPSG, USG, SOG, etc.

The third contact plug 350 may be formed through the third insulating interlayer 340 to make contact with the pad 335. The third contact plug 350 may include, e.g., doped polysilicon, a metal or a metal silicide.

A fourth insulating interlayer 410 may be formed on the third insulating interlayer 340. The fourth insulating interlayer 410 may include, e.g., silicon oxide such as BPSG, USG, SOG, etc.

The wiring structure 480 may fill a trench 420 through the fourth insulating interlayer 410. The wiring structure 480 may include a barrier layer pattern 435, a metal pattern 475 and a wetting improvement layer pattern 465. The metal pattern 475 may be formed on the barrier layer pattern 435 to fill a remaining portion of the trench 420 and may have no void therein. The wetting improvement layer pattern 465 may be formed in the trench 420, e.g., in the metal pattern 475. The wetting improvement layer pattern 465 may have a width equal to or less than about ½ of a width of the trench 420.

The barrier layer pattern 435 may include a metal and/or a metal nitride, e.g., tantalum, tantalum nitride, titanium, titanium nitride, ruthenium, cobalt, manganese, etc. The metal pattern 475 may include, e.g., copper. The wetting improvement layer pattern 465 may include a metal and/or a metal nitride, e.g., tantalum, tantalum nitride, titanium, titanium nitride, ruthenium, cobalt, manganese, etc.

The metal pattern 475 of the wiring structure 480 may include copper of a relatively low resistance, and have no void and reduced EM due to the wetting improvement layer pattern 465. Thus, the semiconductor device may have improved electrical characteristics.

FIGS. 10 to 13 are cross-sectional views illustrating a method of manufacturing a semiconductor device in accordance with example embodiments. This method may be used for the semiconductor device in FIG. 9, however, the present inventive concepts may not be limited thereto.

Figure 10:
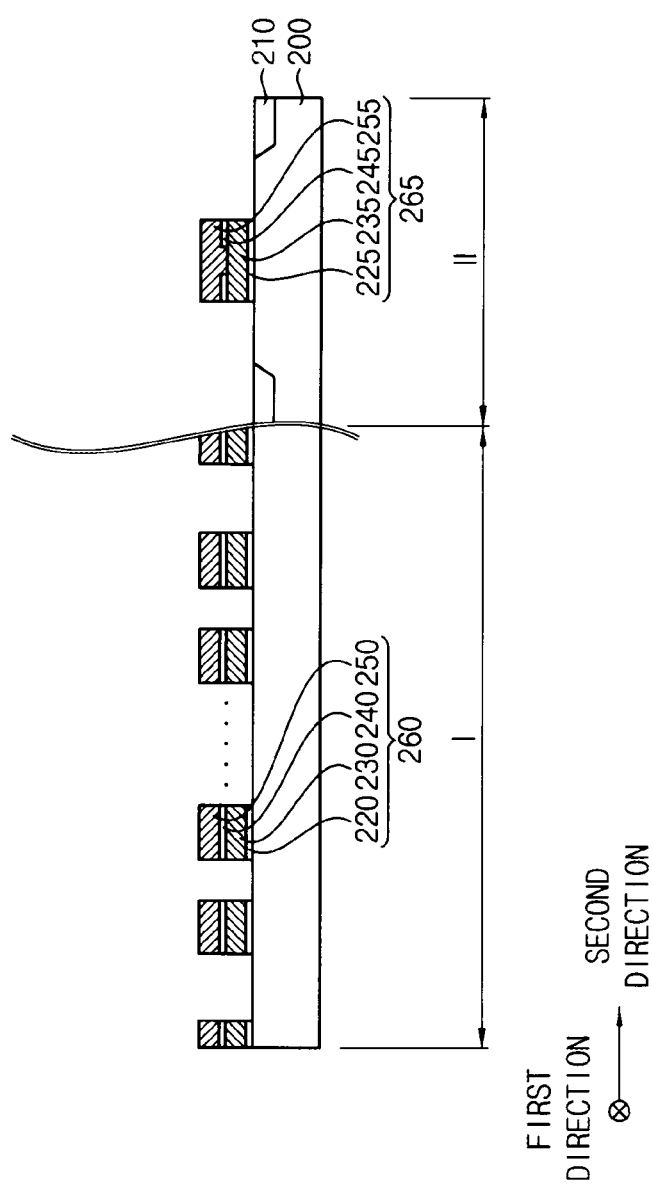

Referring to FIG. 10, first and second gate structures 260 and 265 may be formed on a substrate 200 having an isolation layer 210 thereon.

The substrate 200 may be divided into an active region and a field region by the isolation layer. In an example embodiment, the isolation layer 210 may be formed by a shallow trench isolation (STI) process.

The substrate 200 may include a cell region I in which memory cells may be formed and a peripheral circuit region II in which peripheral circuits may be formed. In an example embodiment, the active region in the cell region I of the substrate 200 may extend in a second direction parallel to a top surface of the substrate 200, and a plurality of active regions may be formed in a first direction substantially perpendicular to the second direction. In FIG. 10, only the active region in the cell region I is illustrated.

The first and second gate structures 260 and 265 may be formed by sequentially forming and patterning a tunnel insulation layer, a floating gate layer, a dielectric layer and a control gate layer on the substrate 200. In an example embodiment, the control gate layer, the dielectric layer, the floating gate layer and the tunnel insulation layer may be patterned using a gate mask (not shown) on the control gate layer to form the gate structures 260 and 265.

The tunnel insulation layer may be formed to include an oxide, e.g., silicon oxide, an oxynitride, e.g., silicon oxynitride, silicon oxide doped with impurities, a low-k dielectric material, etc., and the floating gate layer may be formed to include doped polysilicon or a metal having a relatively high work function, e.g., tungsten, titanium, cobalt, nickel, etc. The dielectric layer may be formed to include an oxide and/or a nitride. In an example embodiment, the dielectric layer may be formed to have an ONO layer structure or a metal oxide having a high dielectric constant. The high-k metal oxide may include, e.g., hafnium oxide, titanium oxide, tantalum oxide, zirconium oxide, aluminum oxide, etc. The control gate layer may be formed to include doped polysilicon, a metal, a metal nitride, a metal silicide, etc.

In an example embodiment, after forming the dielectric layer, the dielectric layer may be partially removed in the peripheral circuit region II to expose the floating gate layer. Thus, the control gate layer on the dielectric layer may make contact with the exposed floating gate layer to be electrically connected thereto. In an example embodiment, a portion of the dielectric layer in the cell region I may be also removed so that the control gate layer and the floating gate layer may be electrically connected to each other.

Accordingly, the first gate structure 260 may include a first tunnel insulation layer pattern 220, a first floating gate 230, a first dielectric layer pattern 240 and a first control gate 250 sequentially stacked in the cell region I of the substrate 200. In an example embodiment, a plurality of first gate structures 260 may be formed in the second direction. The second gate structure 265 may include a second tunnel insulation layer pattern 225, a second floating gate 235, a second dielectric layer pattern 245 and a second control gate 255 sequentially stacked in the peripheral region II of the substrate 200. The second control gate 255 may make contact with the second floating gate 235, thereby being electrically connected thereto.

Alternatively, the first and second gate structures 260 and 265 may include tunnel insulation layer patterns 220 and 225, charge trapping layer patterns (not shown), blocking layer patterns (not shown) and gate electrodes (not shown), respectively, sequentially stacked on the substrate 200.

The charge trapping layer patterns may be formed to include a nitride, e.g., silicon nitride or an oxide, e.g., hafnium oxide. The blocking layer patterns may be formed to include silicon oxide or a metal oxide having a high dielectric constant, e.g., hafnium oxide, titanium oxide, tantalum oxide, zirconium oxide, aluminum oxide. The gate electrodes may be formed to include doped polysilicon, a metal of a relatively low resistance, e.g., aluminum, copper, etc., a metal nitride, a metal silicide, etc.

Hereinafter, only the case in which the floating gates 230 and 235, the dielectric layer patterns 240 and 245 and the control gates 250 and 255 are sequentially stacked on the tunnel insulation layer patterns 220 and 225, respectively, may be illustrated.

In an example embodiment, the first tunnel insulation layer patterns 220 may be islands in relation to each other on the active region of the substrate 200, and the first floating gates 230 may also be islands thereon. Each of the first dielectric layer patterns 240 and the first control gates 250 may extend in the first direction. The first dielectric layer patterns 240 and the first control gates 250 may be sequentially stacked on the first floating gates 230 and the isolation layer 210. Alternatively, the first tunnel insulation layer patterns 220 may not be islands, but extend in the second direction on the active region of the substrate 200.

Figure 11:
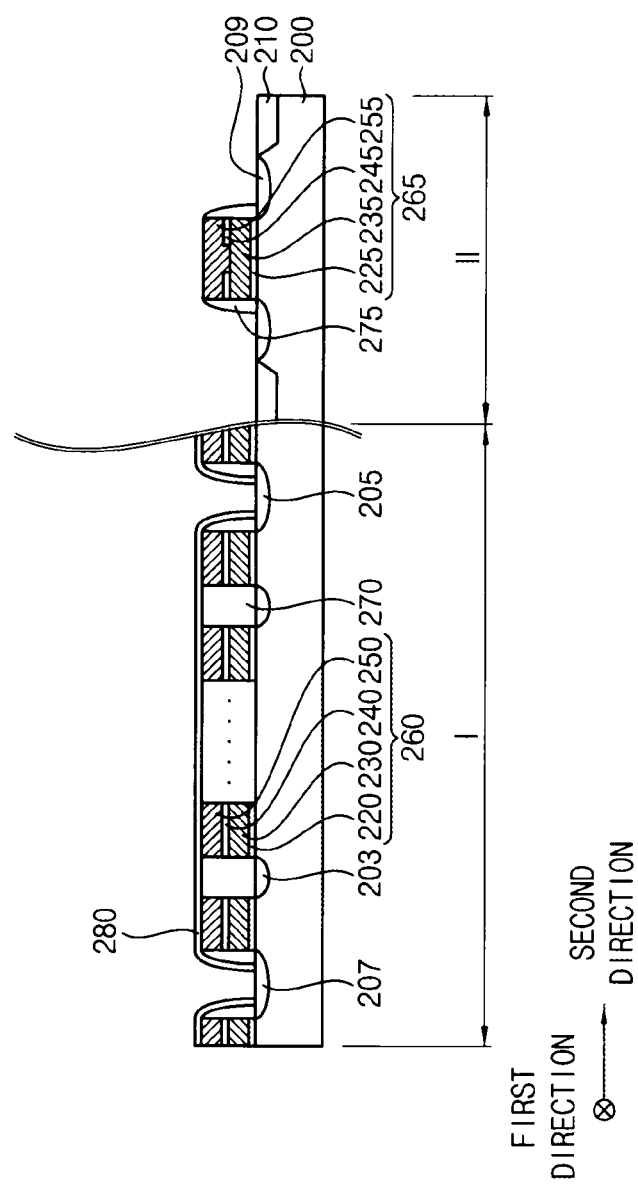

Referring to FIG. 11, an ion implantation process may be performed using the gate structures 260 and 265 as an ion implantation mask to form first to fourth impurity regions 203, 205, 207 and 209 at upper portions of the active region of the substrate 200 adjacent to the gate structures 260 and 265. In an example embodiment, the first impurity region 203 may be formed at an upper portion of the active region of the substrate 200 between the first gate structures 260 spaced apart from each other at a relatively short distance in the cell region I, and the second and third impurity regions 205 and 207 may be formed at upper portions of the active region of the substrate 200 between the first gate structures 260 spaced apart from each other at a relatively long distance in the cell region I. The fourth impurity region 209 may be formed at an upper portion of the active region of the substrate 200 adjacent to the second gate structure 265 in the peripheral circuit region II. In an example embodiment, a plurality of the first gate structures 260 between the second and third impurity regions 205 and 207 and the first impurity region 203 may form a string.

A spacer layer covering the gate structures 260 and 265 may be formed on the substrate 200. The spacer layer may be formed using a nitride, e.g., silicon nitride by a CVD process, an ALD process, a PVD process, etc. The spacer layer may be anisotropically etched to form first and second spacers 270 and 275 on sidewalls of the first and second gate structures 260 and 265. Spaces between the first gate structures 260 spaced apart from each other at a relatively short distance in the cell region I, e.g., spaces between the first gate structures 260 in a string, may be filled by the first spacers 270.

A protection layer covering the spacers 270 and 275 and the gate structures 260 and 265 may be formed. The protection layer may be formed to include a nitride, e.g., silicon nitride by a CVD process, an ALD process, a PVD process, etc. The protection layer may be partially removed by an etching process to form a protection layer pattern 280 covering the first gate structures 260 and the first spacers 270.

Figure 12:
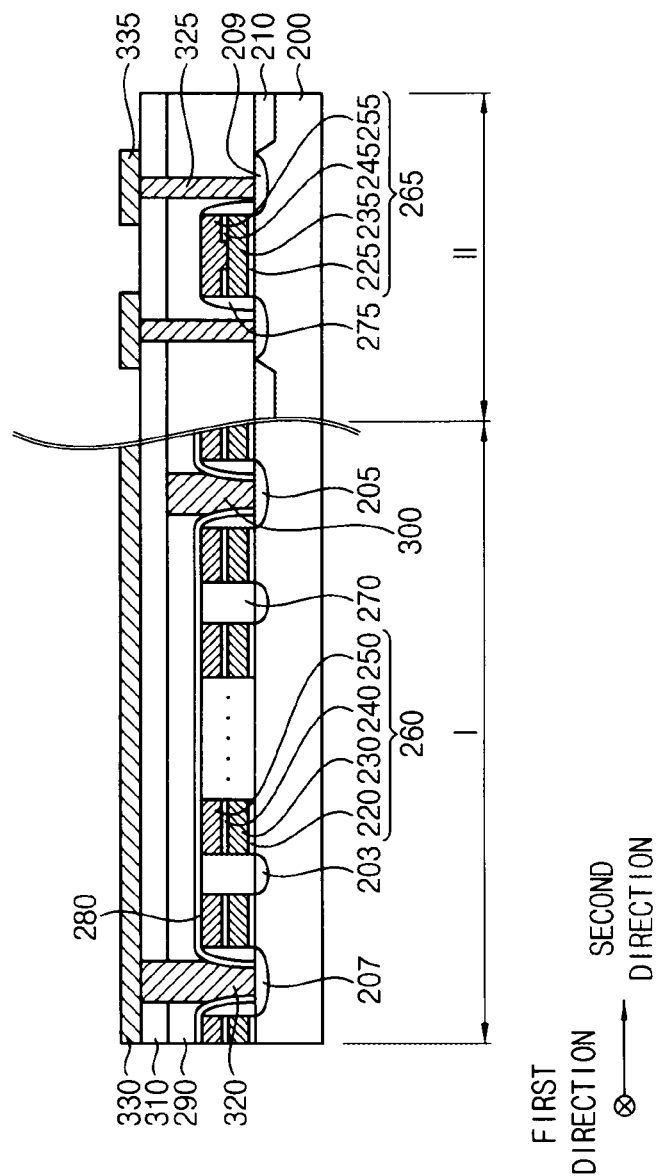

Referring to FIG. 12, a first insulating interlayer 290 covering the protection layer pattern 280, the second gate structure 265 and the second spacer 275 may be formed on the substrate 200. The first insulating interlayer 290 may be formed using silicon oxide, e.g., BPSG, USG, SOG, etc., by a CVD process, an ALD process, a PVD process, etc.

A first opening (not shown) may be formed through the first insulating interlayer 290 to expose the second impurity region 205, and a first conductive layer filling the first opening may be formed on the exposed second impurity region 205 and the first insulating interlayer 290. The first conductive layer may be formed using doped polysilicon, a metal or a metal silicide. An upper portion of the first conductive layer may be planarized until the first insulating interlayer 290 may be exposed to form a CSL 300 filling the first opening and making contact with the second impurity region 205.

A second insulating interlayer 310 may be formed on the first insulating interlayer 290 and the CSL 300. In an example embodiment, the second insulating interlayer 310 may be formed using silicon oxide, e.g., BPSG, USG, SOG, etc., by a CVD process, an ALD process, a PVD process, etc.

A second opening (not shown) may be formed through the first and second insulating interlayers 290 and 310 to expose the third impurity region 207, and a third opening (not shown) may be formed through the first and second insulating interlayers 290 and 310 to expose the fourth impurity region 209. A second conductive layer filling the second and third openings may be formed on the third and fourth impurity regions 207 and 209 and the second insulating interlayer 310. The second conductive layer may be formed using doped polysilicon, a metal or a metal silicide. An upper portion of the second conductive layer may be planarized until the second insulating interlayer 310 is exposed to form a first contact plug 320 filling the second opening and making contact with the third impurity region 207 and a second contact plug 325 filling the third opening and making contact with the fourth impurity region 209.

A bit line 330 electrically connected to the first contact plug 320 and a pad 335 electrically connected to the second contact plug 325 may be formed on the second insulating interlayer 310 using doped polysilicon, a metal or a metal silicide. In an example embodiment, the bit line 330 may extend in the second direction. Alternatively, a wiring (not shown) may be formed instead of the pad 335. The wiring may be formed by processes substantially the same as that of the wiring structure 480 (refer to FIG. 9).

Figure 13:
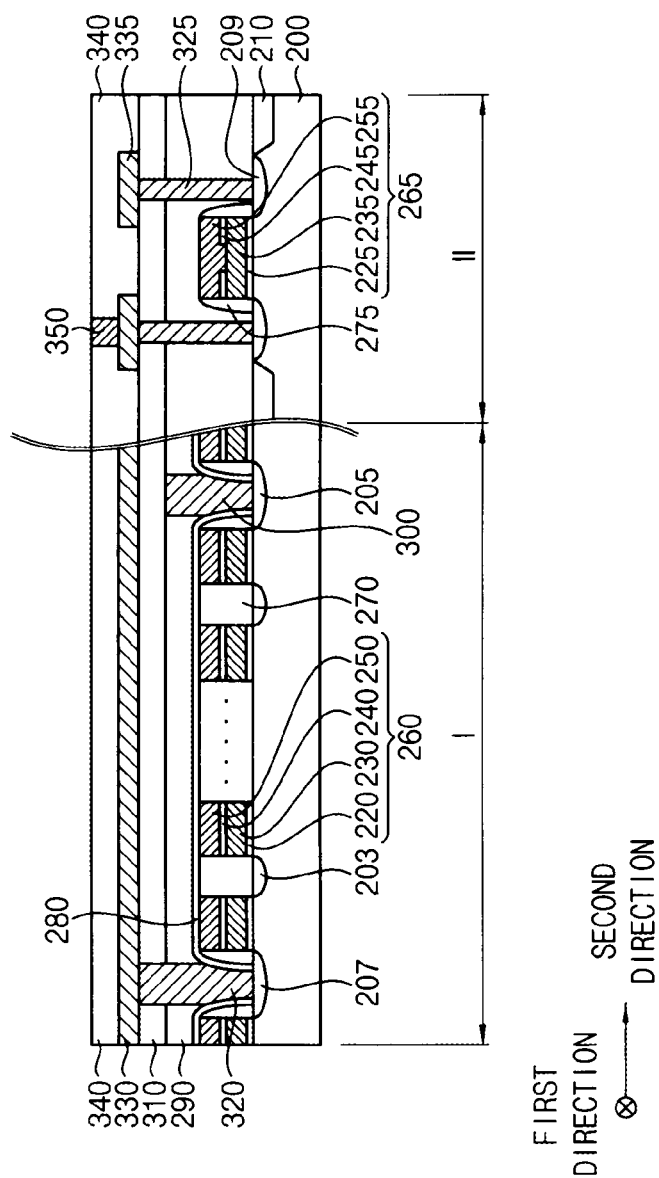

Referring to FIG. 13, a third insulating interlayer 340 covering the bit line 330 and the pad 335 may be formed on the second insulating interlayer 310. The third insulating interlayer 340 may be partially removed to form a fourth opening (not shown) to expose the pad 335, and a third conductive layer filling the fourth opening may be formed on the exposed pad 335 and the second insulating interlayer 310. The third conductive layer may be formed to include doped polysilicon, a metal or a metal silicide. An upper portion of the third conductive layer may be planarized until the third insulating interlayer 340 may be exposed to form a third contact plug 350 filling the fourth opening and making contact with the pad 335.

Referring to FIG. 9 again, processes substantially the same as those illustrated with reference to FIGS. 1 to 8 may be performed to manufacture the semiconductor device.

That is, after forming a fourth insulating interlayer 410 on the third insulating interlayer 340, a wiring structure 480 filling a trench 420 through the fourth insulating interlayer 410 may be formed. The wiring structure 480 may be formed to include a barrier layer pattern 435, a metal pattern 475 and a wetting improvement layer pattern 465, and the metal pattern 475 may be formed on the barrier layer pattern 435 to fill a remaining portion of the trench 420 and may have no void therein. The wetting improvement layer pattern 465 may be formed in the trench 420, e.g., in the metal pattern 475, and may have a width equal to or less than about ½ of a width of the trench 420.

Figure 14:
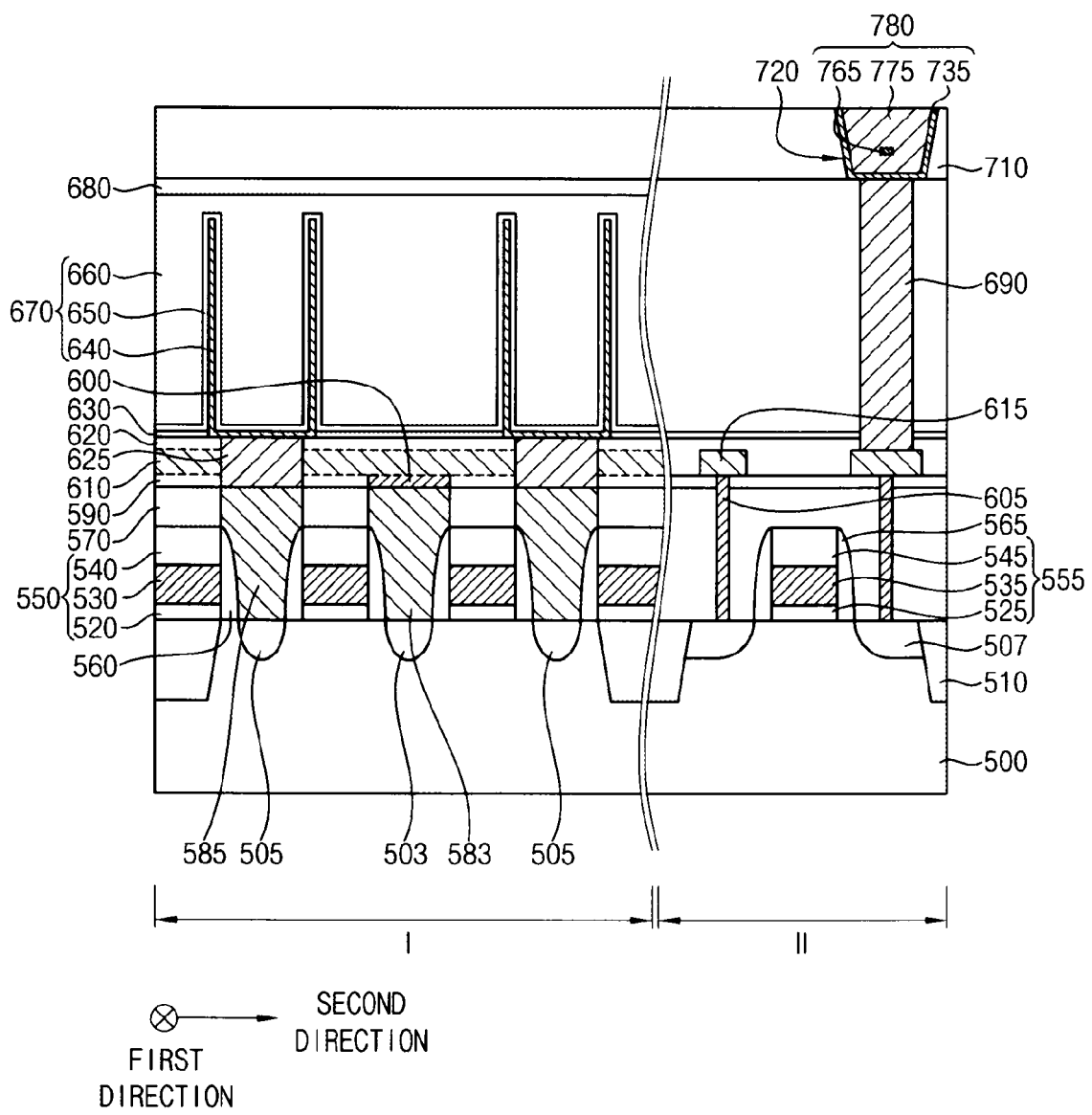

FIG. 14 is a cross-sectional view illustrating a semiconductor device in accordance with example embodiments. FIG. 14 illustrates a dynamic random access memory (DRAM) device, however, the present inventive concept may not be limited thereto.

Referring to FIG. 14, the semiconductor device may have first and second gate structures 550 and 555 and a wiring structure 780 on a substrate 500. The semiconductor device may further include impurity regions 503, 505 and 507, a bit line 610, a capacitor 670, contact plugs 583, 585, 600, 605, 625 and 690, and a pad 615.

The substrate 500 may be divided into a field region in which an isolation layer 510 is formed and an active region in which the isolation layer 510 is not formed. The substrate 500 may include a cell region I in which memory cells may be formed and a peripheral circuit region II in which peripheral circuits for driving the memory cells may be formed.

The first gate structure 550 may include a first gate insulation layer pattern 520, a first gate electrode 530 and a first gate mask 540 sequentially stacked on the cell region I of the substrate 200, and the second gate structure 555 may include a second gate insulation layer pattern 525, a second gate electrode 535 and a second gate mask 545 sequentially stacked on the peripheral circuit region II of the substrate 200. In an example embodiment, each of the gate structures 550 and 555 may extend in a first direction substantially parallel to a top surface of the substrate 500, and a plurality of gate structures 550 and 555 may be formed in a second direction substantially perpendicular to the first direction. First and second spacers 560 and 565 may be formed on sidewalls of the first and second gate structures 550 and 555.

The impurity regions 503, 505 and 507 may be formed at upper portions of the active region of the substrate 500 adjacent to the gate structures 550 and 555. Particularly, the first and second impurity regions 503 and 505 may be formed at upper portions of the cell region I of the substrate 500 adjacent to the first gate structure 550, and the third impurity region 507 may be formed at an upper portion of the peripheral circuit region II of the substrate 500 adjacent to the second gate structure 555.

A first insulating interlayer 570 covering the gate structures 550 and 555 and the spacers 560 and 565 may be formed on the substrate 500. The first insulating interlayer 570 may include an oxide, e.g., BPSG, USG, SOG, etc.

The first and second contact plugs 583 and 585 may be formed through the first insulating interlayer 570 to make contact with the first and second impurity regions 503 and 505. The first and second contact plugs 583 and 585 may include doped polysilicon, a metal and/or a metal silicide.

A second insulating interlayer 590 may be formed on the first insulating interlayer 570 and the first and second contact plugs 583 and 585. The second insulating interlayer 590 may include an oxide, e.g., BPSG, USG, SOG, etc., like the first insulating interlayer 570.

The third contact plug 600 may be formed through the second insulating interlayer 590 to make contact with the first contact plug 583, and the fourth contact plug 605 may be formed through the first and second insulating interlayers 570 and 590 to make contact with the third impurity region 507. The third and fourth contact plugs 600 and 605 may include doped polysilicon, a metal, a metal nitride, and/or a metal silicide.

The bit line 610 and the pad 615 may be formed on the second insulating interlayer 590 to make contact with the third contact plug 600 and the fourth contact plug 605. The bit line 610 and the pad 615 may include doped polysilicon, a metal, a metal nitride and/or a metal silicide. In an example embodiment, the bit line 610 may extend in the second direction. A wiring (not shown) may be formed instead of the pad 615. The wiring may have a structure substantially the same as or similar to that of the wiring structure 780.

A third insulating interlayer 620 covering the bit line 610 and the pad 615 may be formed on the second insulating interlayer 590. The third insulating interlayer 620 may include an oxide, e.g., BPGS, USG, SOG, etc., like the first and second insulating interlayers 570 and 590.

The fifth contact plugs 625 may be formed through the second and third insulating interlayers 590 and 620 to make contact with the second contact plugs 585. The fifth contact plugs 625 may include doped polysilicon, a metal, a metal nitride and/or a metal silicide. An etch stop layer 630 including, e.g., silicon nitride, may be formed on the third insulating interlayer 620.

The capacitor 670 may be formed on the exposed fifth contact plugs 625 and the etch stop layer 630 in the cell region I. The capacitor 670 may include a lower electrode 640, a dielectric layer pattern 650 and an upper electrode 660. The lower electrode 640 may be formed on the exposed fifth contact plug 625 and the third insulating interlayer 620, and a lower portion of the lower electrode 640 may be surrounded by the etch stop layer 630. In an example embodiment, the lower electrode 640 may have a cylindrical shape. The dielectric layer pattern 650 may be formed on the lower electrode 640 and the etch stop layer 630. The upper electrode 660 may be formed on the dielectric layer pattern 650.

The lower and upper electrodes 640 and 660 may include doped polysilicon, a metal, a metal nitride and/or a metal silicide. The dielectric layer pattern 650 may include, e.g., silicon nitride, or a high-k dielectric material such as tantalum oxide, hafnium oxide, aluminum oxide, zirconium oxide, etc.

A fourth insulating interlayer 680 covering the capacitor 670 may be formed on the etch stop layer 630 and/or the third insulating interlayer 620. The fourth insulating interlayer 680 may include an oxide, e.g., BPSG, USG, SOG, etc., like the first to third insulating interlayers 570, 590 and 620.

The sixth contact plug 690 may be formed through the fourth insulating interlayer 680, the etch stop layer 630 and a portion of the third insulating interlayer 620 to make contact with the pad 615. The sixth contact plug 690 may include doped polysilicon, a metal, a metal nitride and/or a metal silicide.

A fifth insulating interlayer 710 may be formed on the fourth insulating interlayer 680. The fifth insulating interlayer 710 may include an oxide, e.g., BPSG, USG, SOG, etc., like the first to fourth insulating interlayers 570, 590, 620 and 680.

The wiring structure 780 may fill a trench 720 through the fourth insulating interlayer 710. The wiring structure 780 may include a barrier layer pattern 735, a metal pattern 775 and a wetting improvement layer pattern 765, and the metal pattern 775 may be formed on the barrier layer pattern 735 to fill a remaining portion of the trench 720 and may have no void therein. The wetting improvement layer pattern 765 may be formed in the trench 720, e.g., in the metal pattern 775, and may have a width equal to or less than about ½ of a width of the trench 720.

The barrier layer pattern 735 may include a metal and/or a metal nitride, e.g., tantalum, tantalum nitride, titanium, titanium nitride, ruthenium, cobalt, manganese, etc. For example, the metal pattern 775 may include copper. The wetting improvement layer pattern 765 may include a metal and/or a metal nitride, e.g., tantalum, tantalum nitride, titanium, titanium nitride, ruthenium, cobalt, manganese, etc.

The metal pattern 775 of the wiring structure 780 may include copper of relatively low resistance and have no void therein. Additionally, the metal pattern 775 may have a reduced EM due to the wetting improvement layer pattern 765. Thus, the semiconductor device having the wiring structure 780 may have improved electrical characteristics.

Figure 15:
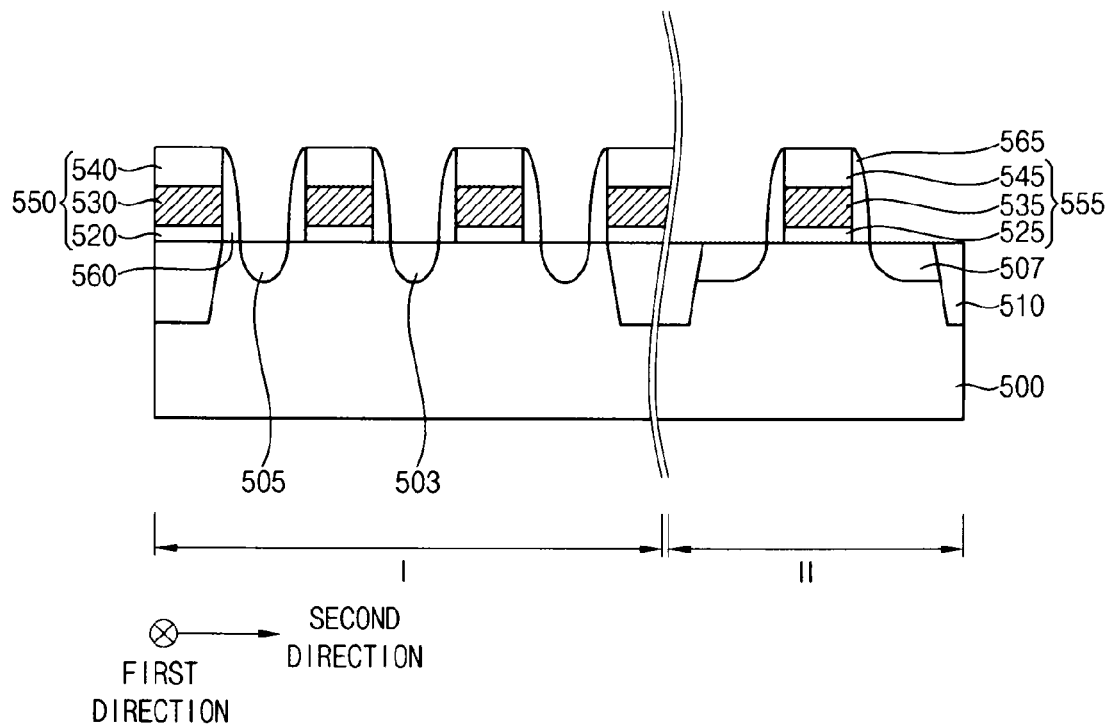
Figure 16:
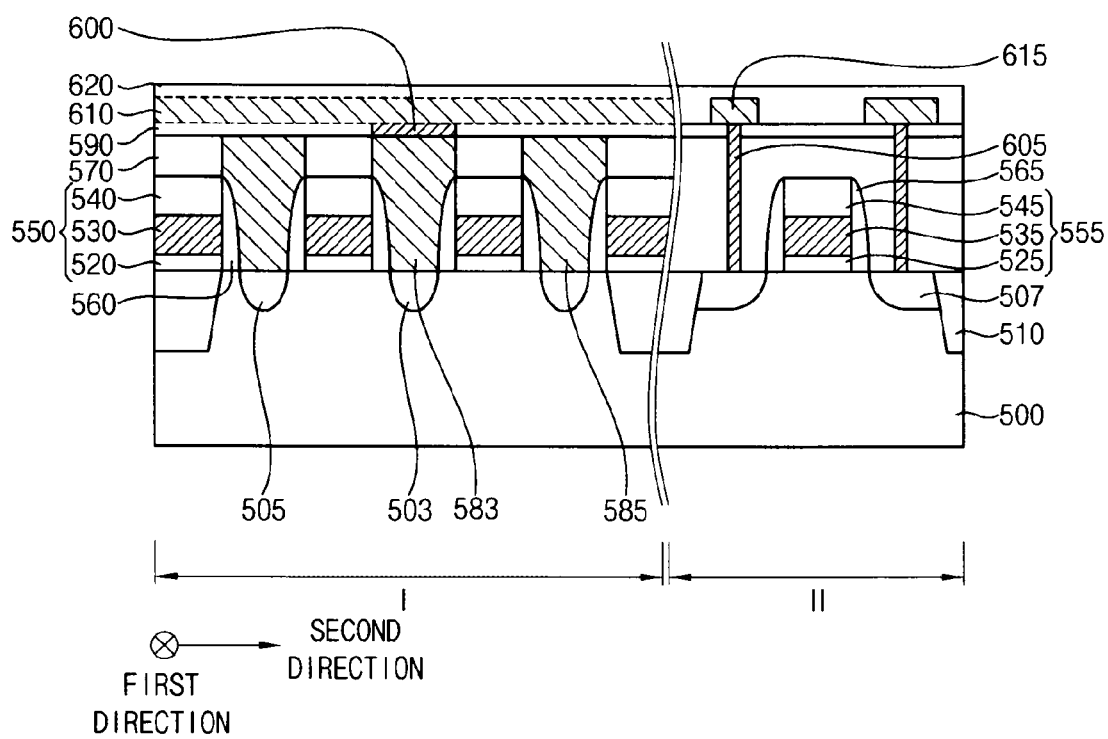
Figure 17:
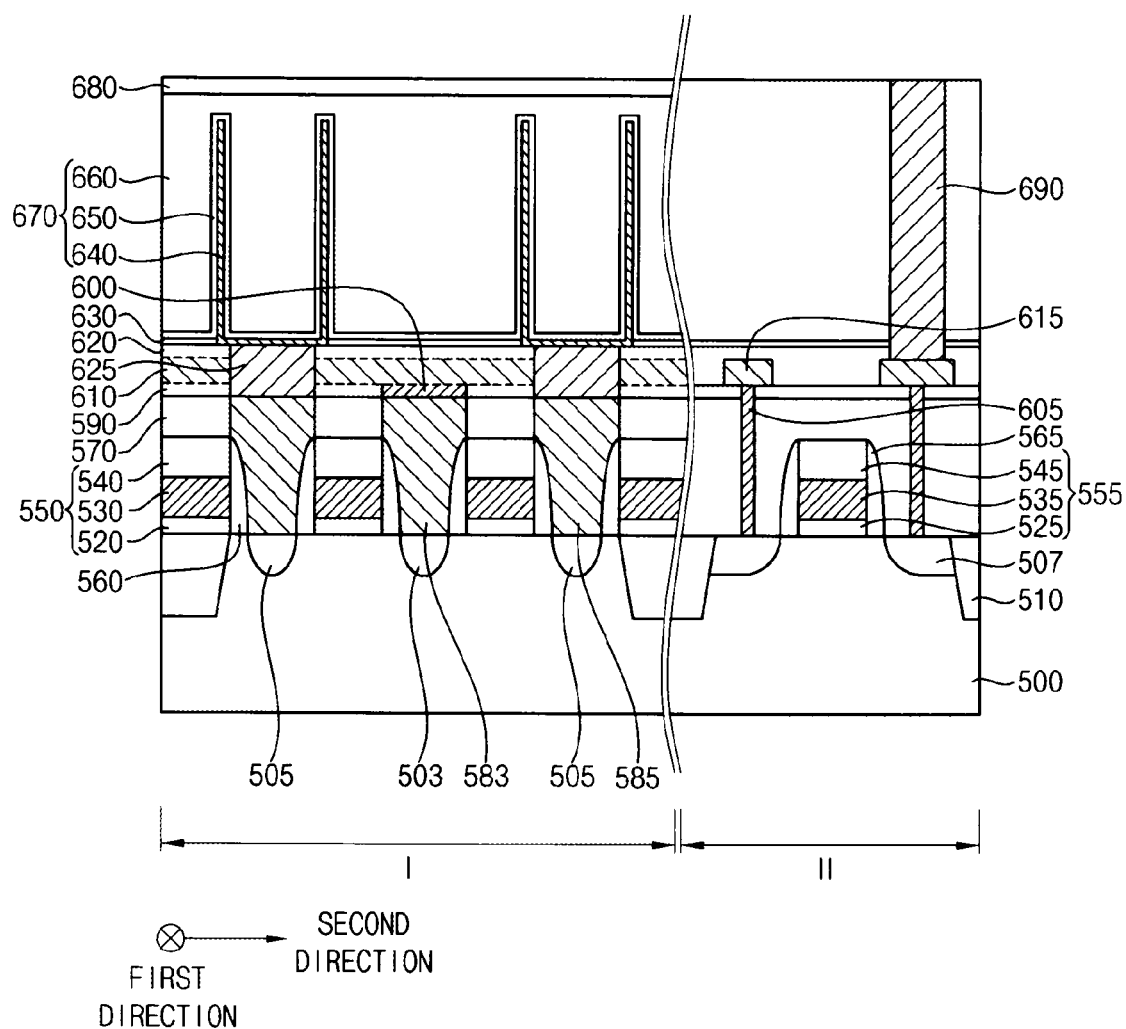

FIGS. 15 to 17 are cross-sectional views illustrating a method of manufacturing a semiconductor device in accordance with example embodiments. This method may be used for manufacturing the semiconductor device of FIG. 14, however, the scope of the inventive concepts may not be limited thereto.

Referring to FIG. 15, an isolation layer 510 may be formed on a substrate 500, and first and second gate structures 550 and 555 may be formed on a cell region I and a peripheral circuit region II, respectively, of the substrate 500. The cell region I may be a region in which memory cells may be formed, and the peripheral circuit region II may be a region in which peripheral circuits may be formed.

The first and second gate structures 550 and 555 may be formed by forming a gate insulation layer, a gate conductive layer and a gate mask layer on the substrate 500 and patterning the gate mask layer, the gate conductive layer and the gate insulation layer. Thus, the first gate structure 550 may be formed to include a first gate insulation layer pattern 520, a first gate electrode 530 and a first gate mask 540 sequentially stacked on the cell region I of the substrate 500, and the second gate structure 555 may be formed to include a second gate insulation layer pattern 525, a second gate electrode 535 and a second gate mask 545 sequentially stacked on the peripheral circuit region II of the substrate 500. In an example embodiment, each of the gate structures 550 and 555 may extend in a first direction parallel to a top surface of the substrate 500, and a plurality of first gate structures 550 and a plurality of second gate structures 555 may be formed in a second direction substantially perpendicular to the first direction.

A first gate spacer 560 and a second gate spacer 565 may be formed on a sidewall of the first gate structure 550 and a sidewall of the second gate structure 555, respectively. Particularly, a spacer layer covering the first and second gate structures 550 and 555 may be formed on the substrate 500, and the spacer layer may be anisotropically etched to form the first and second spacers 560 and 565.

Impurities may be implanted into an upper portion of the substrate 500 using the gate structures 550 and 555 and the spacers 560 and 565 as an ion implantation mask to form first and second impurity regions 503 and 505 at upper portions of the active region of the substrate 500 adjacent to the first gate structures 550, and to form a third impurity region 507 at an upper portion of the active region of the substrate 500 adjacent to the second gate structure 555.

Referring to FIG. 16, a first insulating interlayer 570 covering the gate structures 550 and 555 and the spacers 560 and 565 may be formed on the substrate 500. The first insulating interlayer 570 may be formed to include an oxide, e.g., BPSG, USG, SOG, etc.

First openings (not shown) may be formed through the first insulating interlayer 570 to expose first and second impurity regions 503 and 505, and a first conductive layer covering the first openings may be formed on the first insulating interlayer 570. The first conductive layer may be formed to include doped polysilicon, a metal and/or a metal silicide. An upper portion of the first conductive layer may be planarized until the first insulating interlayer 570 may be exposed to form first and second contact plugs 583 and 585 electrically connected to the first and second impurity regions 503 and 505, respectively.

A second insulating interlayer 590 may be formed on the first insulating interlayer 570 and the contact plugs 583 and 585, and second openings (not shown) may be formed through the second insulating interlayer 590 and/or the first insulating interlayer 570 to expose the first contact plug 583 and the third impurity region 507. The second insulating interlayer 590 may be formed to include an oxide, e.g., BPSG, USG, SOG, etc., like the first insulating interlayer 570. A second conductive layer filling the second openings may be formed on the substrate 500, the first contact plug 583 and the second insulating interlayer 590. The second conductive layer may be formed to include doped polysilicon, a metal, a metal nitride and/or a metal silicide. An upper portion of the second conductive layer may be planarized until the second insulating interlayer 590 may be exposed to form a third contact plug 600 electrically connected to the first contact plug 583 and a fourth contact plug 605 electrically connected to the third impurity region 507.

A third conductive layer making contact with the third contact plug 600 and the fourth contact plug 605 may be formed on the second insulating interlayer 590 and patterned to form a bit line 610 electrically connected to the third contact plug 600 and a pad 615 electrically connected to the fourth contact plug 605. The third conductive layer may be formed to include doped polysilicon, a metal, a metal nitride and/or a metal silicide. In an example embodiment, the bit line 610 may be formed to extend in the second direction. A wiring (not shown) may be formed instead of the pad 615. The wiring may be formed by processes substantially the same as those for forming the wiring structure 780 (refer to FIG. 14).

A third insulating interlayer 620 covering the bit line 610 and the pad 615 may be formed on the second insulating interlayer 590. The third insulating interlayer 620 may be formed to include an oxide, e.g., BPSG, USG, SOG, etc., like the first and second insulating interlayers 570 and 590.

Referring to FIG. 17, third openings (not shown) may be formed through the second and third insulating interlayers 590 and 620 to expose the second contact plugs 585. A fourth conductive layer filling the third openings may be formed on the second contact plugs 585 and the third insulating interlayer 620. The fourth conductive layer may be formed to include doped polysilicon, a metal, a metal nitride and/or a metal silicide. An upper portion of the fourth conductive layer may be planarized until the third insulating interlayer 620 may be exposed to form fifth contact plugs 625 electrically connected to the second contact plugs 585.

An etch stop layer 630 and a mold layer (not shown) may be formed on the fifth contact plugs 625 and the third insulating interlayer 620. In an example embodiment, the etch stop layer 630 may be formed to include silicon nitride, the mold layer may be formed to include silicon oxide. Fourth openings (not shown) may be formed through the mold layer and the etch stop layer 630 to expose the fifth contact plugs 625. A fifth conductive layer may be formed on the exposed fifth contact plugs 625, a sidewall of the fourth openings and the mold layer, and a sacrificial layer filling the fourth openings may be formed on the fifth conductive layer. The fifth conductive layer may be formed to include doped polysilicon, a metal, a metal nitride and/or a metal silicide. Upper portions of the sacrificial layer and the fifth conductive layer may be planarized until the mold layer may be exposed, and the sacrificial layer and the mold layer may be removed. Thus, a lower electrode 640 may be formed on the exposed fifth contact plugs 625 and the sidewall of the fourth openings.

A dielectric layer and an upper electrode layer may be formed on the lower electrode 640 and the etch stop layer 630 and patterned to form a dielectric layer pattern 650 and an upper electrode 660, respectively. The dielectric layer may be formed to include silicon nitride or a high-k dielectric material, e.g., tantalum oxide, hafnium oxide, aluminum oxide, zirconium oxide, etc. The upper electrode layer may be formed to include doped polysilicon, a metal, a metal nitride and/or a metal silicide.

The lower electrode 640, the dielectric layer pattern 650 and the upper electrode 660 may form a capacitor 670.

A fourth insulating interlayer 680 covering the capacitor 670 may be formed on the etch stop layer 630 and/or the third insulating interlayer 620. The fourth insulating interlayer 680 may be formed to include an oxide, e.g., BPSG, USG, SOG, etc., like the first to third insulating interlayers 570, 590 and 620. A fifth opening (not shown) may be formed through fourth insulating interlayer 680, the etch stop layer 630 and the third insulating interlayer 620 to expose the pad 615. A sixth conductive layer filling the fifth opening may be formed on the pad 615 and the fourth insulating interlayer 680. The sixth conductive layer may be formed to include doped polysilicon, a metal, a metal nitride and/or a metal silicide. An upper portion of the sixth conductive layer may be planarized until the fourth insulating interlayer 680 may be exposed to form a sixth contact plug 690 electrically connected to the pad 615.

Referring to FIG. 14 again, processes substantially the same as those illustrated with reference to FIGS. 1 to 9 may be performed to form the semiconductor device.

Particularly, a fifth insulating interlayer 710 may be formed on the fourth insulating interlayer 680, and a wiring structure 780 filling a trench 720 through the fifth insulating interlayer 710 may be formed. The wiring structure 780 may include a barrier layer pattern 735, a metal pattern 775 and a wetting improvement layer pattern 765, and the metal pattern 775 may be formed on the barrier layer pattern 735 to fill a remaining portion of the trench 720 and may have no void therein. The wetting improvement layer pattern 765 may be formed in the trench 720, e.g., in the metal pattern 775 and may have a width equal to or less than about ½ of a width of the trench 720.

The method of manufacturing the semiconductor device in accordance with example embodiments may be applied to any semiconductor devices including a copper wiring. This method may be applied not only to flash memory devices or DRAM devices as described above but also to other memory devices, e.g., SRAM devices, PRAM devices, MRAM devices, RRAM devices, etc. Particularly, this method may be applied to a method of manufacturing a semiconductor device including a copper wiring having a width equal to or less than about 20 nm, and further to a method of forming wirings including aluminum instead of copper.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
   forming a trench on an insulating interlayer on a substrate;
   forming a first seed layer on an inner wall of the trench and on the insulating interlayer, the first seed layer having a first thickness on an upper portion of the trench greater than a second thickness on a lower portion of the trench;
   forming a preliminary metal layer filling the lower portion of the trench by performing a reflow process on the first seed layer;
   forming a wetting improvement layer on a portion of the preliminary metal layer on the upper portion of the trench; and
   forming a metal layer filling the trench by an electrolytic plating process.

2. The method of claim 1, wherein the forming a metal layer includes performing the electrolytic plating process using an additive and an electrolyte, the additive having a suppressor, an accelerator and a leveler, and the electrolyte including a copper ion, and
   wherein the forming a wetting improvement layer includes forming at least one of tantalum, tantalum nitride, titanium, titanium nitride, ruthenium, cobalt and manganese.

3. The method of claim 1, further comprising:
   forming a barrier layer on the inner wall of the trench and on the insulating interlayer prior to the forming a first seed layer.

4. The method of claim 1, wherein the forming a first seed layer includes performing a sputtering process using copper as a target when a bias power is applied to the substrate.

5. The method of claim 1, wherein the forming a preliminary metal layer exposes a portion of the inner wall of the trench, the method further comprising:
   forming a second seed layer on the exposed portion of the inner wall of the trench.

6. The method of claim 4, wherein the forming a wetting improvement layer forms the wetting improvement layer on the preliminary metal layer in the trench.

7. The method of claim 1, further comprising:
   reducing oxidized portions of the preliminary metal layer and the wetting improvement layer prior to the forming a metal layer.

8. The method of claim 1, further comprising:
   planarizing the metal layer until the insulating interlayer is exposed after the forming a metal layer,
   wherein the wetting improvement layer on the upper portion of the trench is removed by the planarization of the metal layer.

* * * * *